United States Patent
Wu

(10) Patent No.: US 8,947,885 B2
(45) Date of Patent: Feb. 3, 2015

(54) ELECTRONIC DEVICE WITH EJECTION MECHANISM

(71) Applicants: Fu Tai Hua Industry (Shenzhen) Co., Ltd., Shenzhen (CN); Hon Hai Precision Industry Co., Ltd., New Taipei (TW)

(72) Inventor: Jian-Guo Wu, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 215 days.

(21) Appl. No.: 13/727,610

(22) Filed: Dec. 27, 2012

(65) Prior Publication Data

US 2014/0160642 A1 Jun. 12, 2014

(30) Foreign Application Priority Data

Dec. 12, 2012 (CN) .......................... 2012 1 0533722

(51) Int. Cl.
*G06F 1/16* (2006.01)
*H05K 5/02* (2006.01)
*H04M 1/02* (2006.01)

(52) U.S. Cl.
CPC ............ *G06F 1/1613* (2013.01); *H05K 5/0295* (2013.01); *H04B 1/3816* (2013.01); *H04B 1/3888* (2013.01); *H04M 1/026* (2013.01); *H04M 2250/14* (2013.01)
USPC ................. 361/754; 361/679.31; 361/679.32; 361/679.38; 361/679.4

(58) Field of Classification Search
CPC ...................................... G06F 1/1615
USPC .............................. 361/679.38, 754
See application file for complete search history.

(56) References Cited

U.S. PATENT DOCUMENTS 8,605,451 B2 * 12/2013 Tang .............................. 361/754
2011/0255252 A1 * 10/2011 Sloey et al. .................... 361/752

* cited by examiner

*Primary Examiner* — Anthony Q Edwards
(74) *Attorney, Agent, or Firm* — Novak Druce Connolly Bove + Quigg LLP

(57) ABSTRACT

An electronic device includes a housing, a tray, and an ejection mechanism. The housing defines a slot and a slit in a sidewall thereof. The ejection mechanism includes a button and a pivoting member. The pivoting member includes a first end portion and a second end portion. The button includes a head portion and a shaft portion. The button is slidable along the slit between a first position where the shaft portion contacts the first end portion, the first end portion is urged by the shaft portion to move away from the sidewall, and the second end portion is leveraged to push the tray to move outwardly through the slot, and a second position where the shaft portion contacts the first end portion adjacent to the axis, the first end portion is moved, the tray is entirely received in the housing, and the second end portion abuts against the tray.

4 Claims, 5 Drawing Sheets

ELECTRONIC DEVICE WITH EJECTION MECHANISM

BACKGROUND

1. Technical Field

The present disclosure relates to electronic devices and, particularly, to an electronic device with an ejection mechanism.

2. Description of Related Art

Electronic devices such as notebook computer may include a tray for placing a storage card. When replacing the storage card, a pin is used to directly insert into a slit of the electronic device to trigger the ejection of the tray, but this requires a tool, concentration by the user, and a high degree of dexterity.

Therefore, what is need is an electronic device with an ejection mechanism to overcome the described limitations.

DETAILED DESCRIPTION

Figure 1:
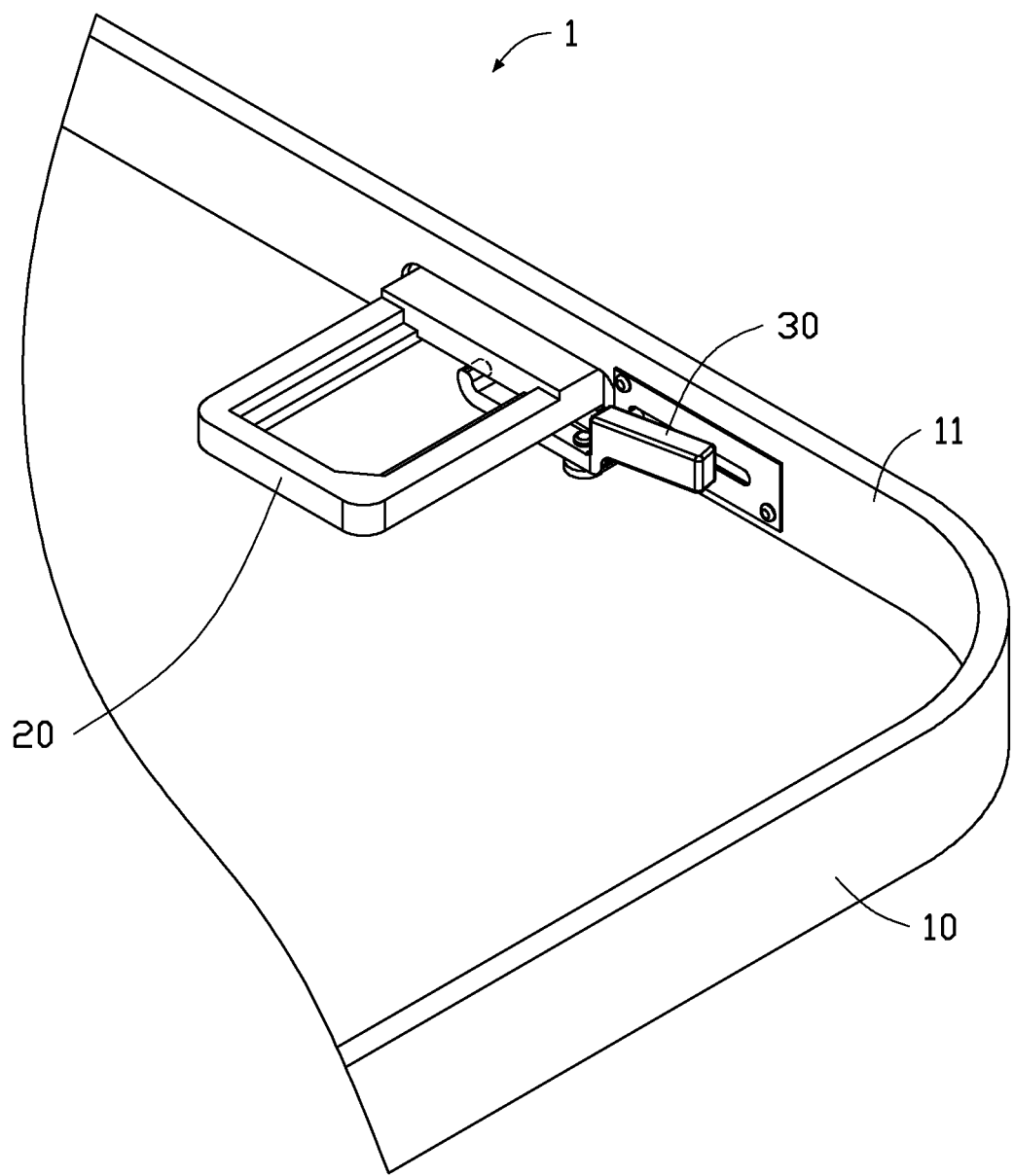
FIG. 1 is an isometric view of an electronic device with an ejection mechanism in accordance with an exemplary embodiment.
Figure 2:
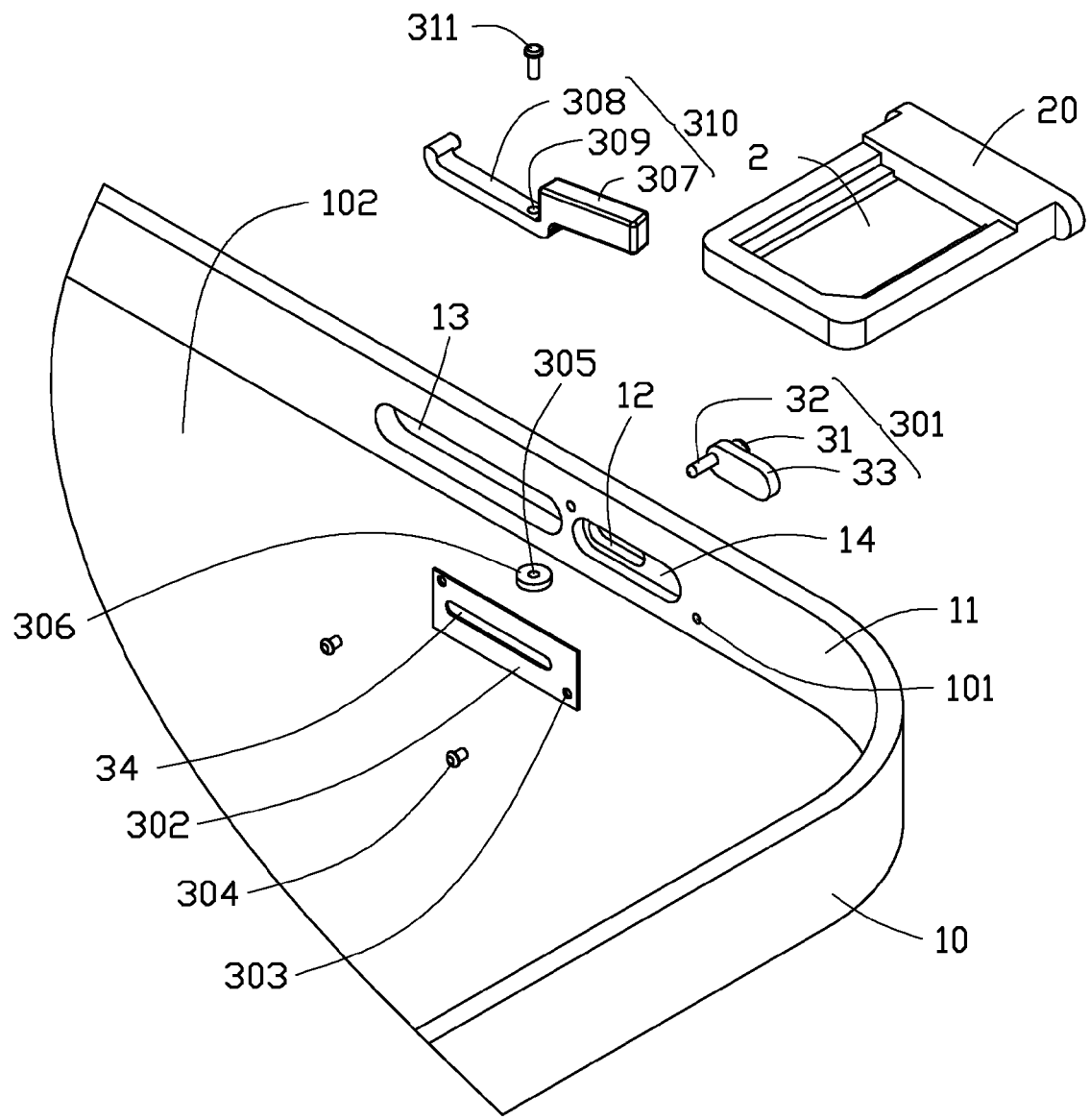
FIG. 2 is an exploded view of the electronic device of FIG. 1.
Figure 3:
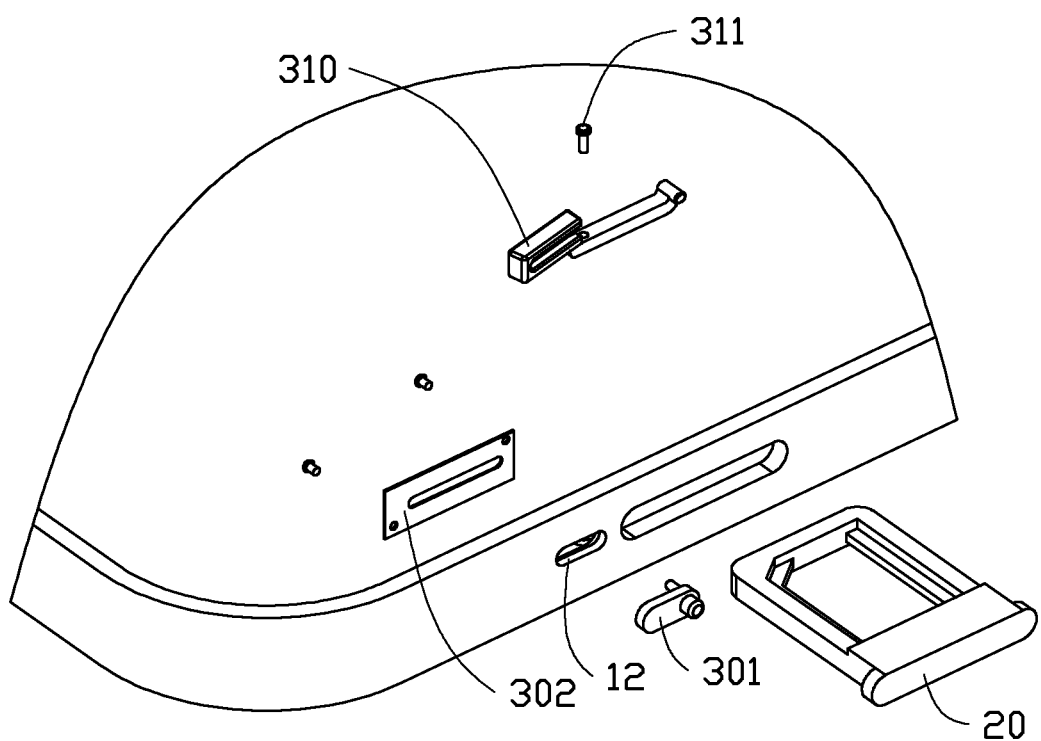
FIG. 3 is an isometric view of the electronic device of FIG. 1, viewed from another angle.

Referring to FIGS. 1-3, an electronic device 1 is provided. The electronic device 1 includes a housing 10. The housing 10 includes a bottom wall 102 and a sidewall 11. A slot 13 and a slit 12 are defined in the sidewall 11 of the housing 10. The electronic device 1 further includes a tray 20 aligned with the slot 13, and received in the housing 10, and an ejection mechanism 30. A storage card 2 is placed in the tray 20. The ejection mechanism 30 includes a button 301 slidably engaged in the slit 12, a first plate 302 opposite to the slit 12, and a pivoting member 310 pivotedly mounted on the bottom wall of the housing 10. In one embodiment, the electronic device 1 may be a phone, a notebook computer, or the like. The pivoting member 310 is rotatable about an axis 305 parallel to the sidewall 11. The pivoting member 310 includes a first end portion 307 and a second end portion 308. The first end portion 307 and the second end portion 308 are located at opposite side of the axis 305 and are bent toward the sidewall 11. The first end portion 307 is opposite to the slit 12. The second end portion 308 is opposite to the slot 13 and resists the tray 20.

In one embodiment, an inner surface of the sidewall 11 of the housing 10 defines a recessed portion 14. The slit 12 is defined in a portion of the recessed portion 14. The button 301 includes a base 33, a head portion 31 exposed at an outside of the housing 10, and a shaft portion 32 extending from the base 33 for contacting the first end portion 307. The head portion 31 and the shaft portion 32 are located at opposite sides of the base 33. The base 33 is movably received in the recessed portion 14. In another embodiment, a receiving groove is defined in the sidewall 11. The button 301 is only a pin. One end of the button 301 is exposed at an outside of the housing 10 via the slit 12, an opposite end is received in the receiving groove, thereby fixing the button 301 to the electronic device. When the user pushes one end of the button 301 along the slit 12, the opposite end of the button 301 moves along the receiving groove to drive the pivoting member 310 to rotate. When ejecting the tray 20, the button 301 is slidable along the slit 12 between a first position where the shaft portion 32 contacts a distal end of the first end portion 307, the first end portion 307 is urged by the shaft portion 32 to move away from the sidewall 11, and the second end portion 308 is leveraged to push the tray 20 to move outwardly through the slot 13. When pushing the tray 20 into the housing 10, a second position where the shaft portion 32 contacts an inner part of the first end portion 307 adjacent to the axis 305, the first end portion 307 is moved adjacent to the sidewall 11, the tray 20 is entirely received in the housing 10, and the second end portion 308 abuts against the tray 20.

The sidewall 11 of the housing 10 defines two first threaded holes 101. The first plate 302 defines two through holes 303 aligned with the two first threaded holes 101. The ejection mechanism 30 further includes two first screws 304. The two first screws 304 pass through the two through holes 303 and the two first axle holes 101 to fix the first plate 302 to the inner surface of the sidewall 11 of the housing 10. The first plate 302 further defines a perforation 34 whose shape matches that of the slit 12. The button 301 is slidably engaged in the slit 12 and the perforation 34.

A second threaded hole 306 is defined in the axis 305. A third threaded hole 309 is defined in an intersection between the first end portion 307 and the second end portion 308. The ejection mechanism 30 further includes a second screw 311. The second screw 311 passes through the third threaded hole 309 and the second threaded hole 306 to rotatably connect the pivoting member 310 to the axis 305.

Figure 4:
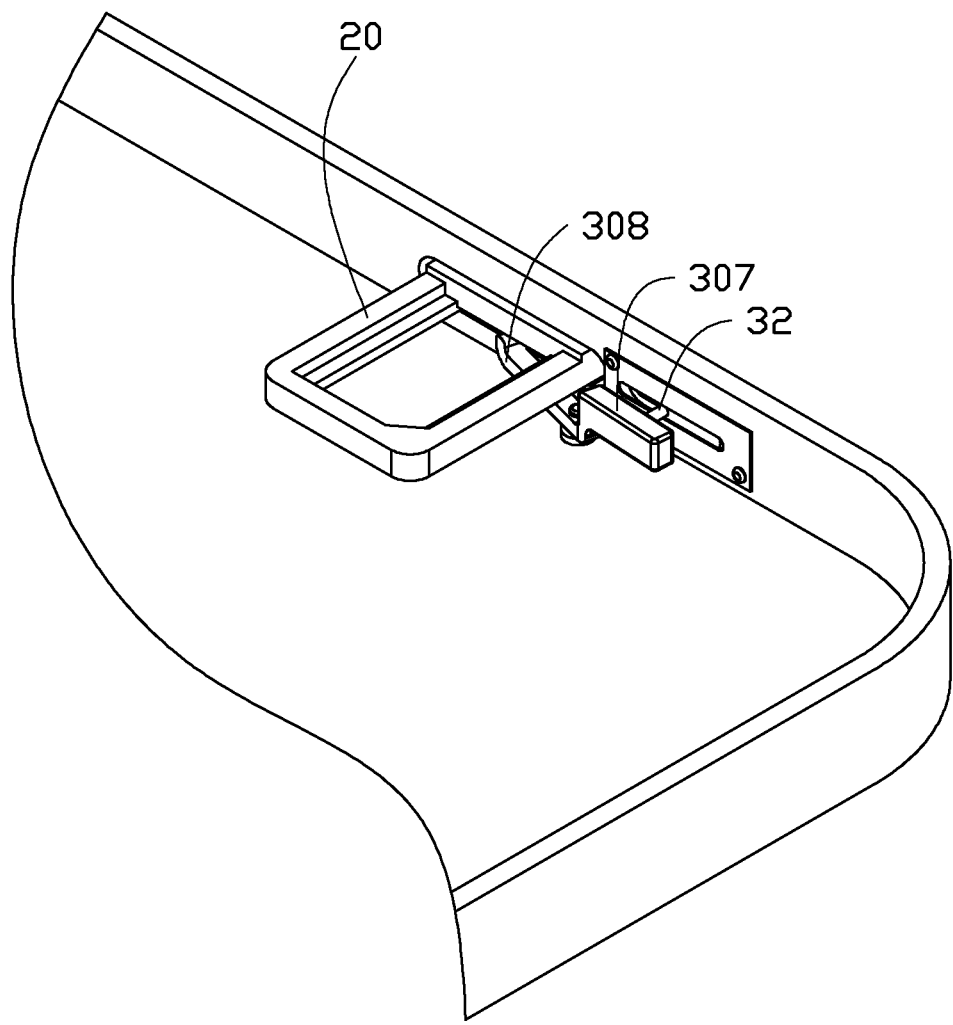
FIG. 4 is a schematic diagram of the electronic device of FIG. 1, when a tray of the electronic device is ejected.
Figure 5:
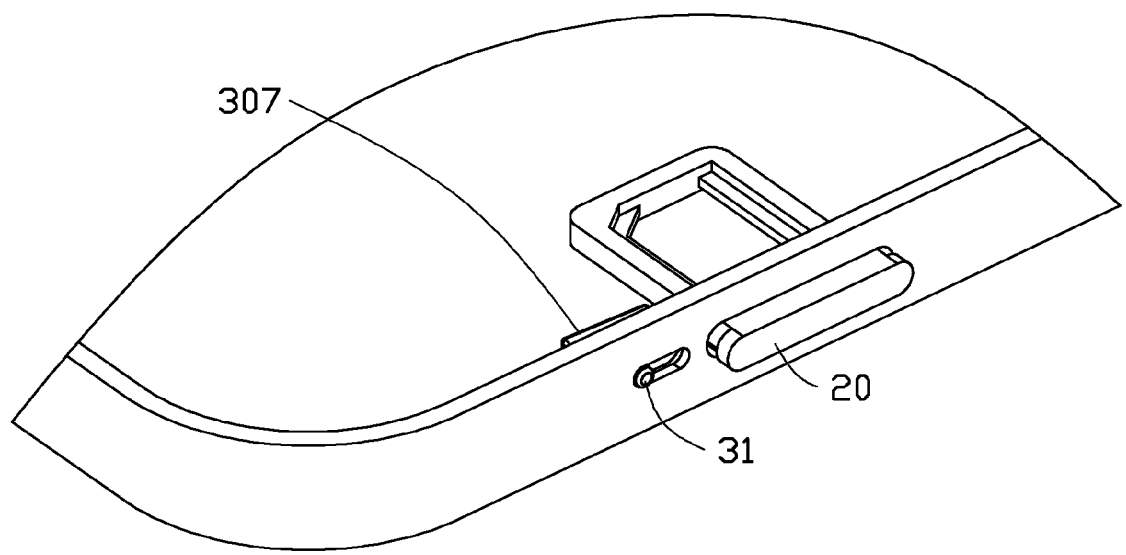
FIG. 5 is a schematic diagram of the electronic device of FIG. 1 viewed from another angle, when the tray of the electronic device is ejected.

As referred to in FIGS. 4-5, when ejecting the tray 20, the head portion 31 of the button 301 is slidable along the slit 12 between a first position where the shaft portion 32 contacts a distal end of the first end portion 307, the first end portion 307 is urged by the shaft portion 32 to move away from the sidewall 11, and the second end portion 308 is leveraged to push the tray 20 to move outwardly through the slot 13. When pushing the tray 20 into the housing 10, a second position where the shaft portion 32 contacts an inner part of the first end portion 307 adjacent to the axis 305, the first end portion 307 is moved adjacent to the sidewall 11, the tray 20 is entirely received in the housing 10, and the second end portion 308 abuts against the tray 20.

Although the present disclosure has been specifically described on the basis of the embodiments thereof, the disclosure is not to be construed as being limited thereto. Various changes or modifications may be made to the embodiments without departing from the scope and spirit of the disclosure.

What is claimed is:

1. An electronic device comprising:
    a housing including a bottom wall and a sidewall, wherein a slot and a slit are defined in the sidewall of the housing;
    a tray aligned with the slot, and received in the housing, wherein the tray is configured for placing a storage card thereon; and
    an ejection mechanism comprising:
        a button slidably engaged in the slit; and
        a pivoting member rotatably mounted to on the bottom wall of the housing, wherein the pivoting member is rotatable about an axis parallel to the sidewall, the pivoting member comprises a first end portion and a second end portion, the first end portion and the second end portion are located at opposite side of the axis, the first end portion is opposite to the slit, the second end portion is opposite to the slot and resists the tray, the button includes a head portion exposed at an outside of the housing, and a shaft portion extending from the head portion configured for contacting the first end portion;

wherein, the button is slidable along the slit between a first position where the shaft portion contacts a distal end of the first end portion, the first end portion is urged by the shaft portion to move away from the sidewall, and the second end portion is leveraged to push the tray to move outwardly through the slot, and a second position where the shaft portion contacts an inner part of the first end portion adjacent to the axis, the first end portion is moved adjacent to the sidewall, the tray is entirely received in the housing, and the second end portion abuts against the tray.

2. The electronic device as described claim 1, wherein when the button is in the first position, the first end portion is substantially parallel to the sidewall, and when the button is in the second position, the first end portion is obliquely oriented relative to the sidewall.

3. The electronic device as described claim 1, wherein the first end portion defines a groove for slidably receiving a distal end of the shaft portion.

4. The electronic device as described claim 1, wherein the pivoting member is bent at a middle point thereof which is on the axis, and the first end portion and the second end portion are bent toward the sidewall.

* * * * *